(12) United States Patent
Wetzel

(10) Patent No.: US 7,193,852 B2
(45) Date of Patent: Mar. 20, 2007

(54) CONTROL UNIT AND METHOD FOR PRODUCING THE SAME

(75) Inventor: Gerhard Wetzel, Korntal-Muenchingen (DE)

(73) Assignee: Robert Bosch GmbH, Stuttgart (DE)

( * ) Notice: Subject to any disclaimer, the term of this patent is extended or adjusted under 35 U.S.C. 154(b) by 143 days.

(21) Appl. No.: 10/528,973

(22) PCT Filed: Jul. 13, 2004

(86) PCT No.: PCT/DE2004/001519

§ 371 (c)(1),
(2), (4) Date: Mar. 23, 2005

(87) PCT Pub. No.: WO2005/025940
PCT Pub. Date: Mar. 24, 2005

(65) Prior Publication Data
US 2006/0023431 A1     Feb. 2, 2006

(30) Foreign Application Priority Data
Sep. 5, 2003   (DE) .............................. 103 40 974

(51) Int. Cl.
*H05K 7/20* (2006.01)
(52) U.S. Cl. ..................... 361/714; 361/719; 361/736; 361/752; 257/726; 439/485
(58) Field of Classification Search ................ 361/714, 361/719, 773, 776, 707–712, 717, 730, 796, 361/807, 810, 819; 257/713, 718, 719, 726, 257/727; 29/852, 857, 831, 840, 846; 174/261, 174/262, 266, 59; 123/31, 41, 198 E; 327/565; 326/47, 101; 439/140, 487; 318/139, 254, 318/256, 280, 287, 293; 165/80.2, 80.3, 165/185
See application file for complete search history.

(56) References Cited

U.S. PATENT DOCUMENTS

| | | | | |
|---|---|---|---|---|
| 4,546,412 A | * | 10/1985 | Nakazawa et al. | 361/743 |
| 4,893,215 A | | 1/1990 | Urushiwara et al. | |
| 5,134,546 A | * | 7/1992 | Izumi et al. | 361/736 |
| 5,586,388 A | * | 12/1996 | Hirao et al. | 29/830 |
| 7,110,246 B2 | * | 9/2006 | Tsunooka et al. | 361/637 |
| 2002/0154486 A1 | | 10/2002 | Koike et al. | |

\* cited by examiner

*Primary Examiner*—Michael Datskovskiy
(74) *Attorney, Agent, or Firm*—Michael J. Striker

(57) ABSTRACT

The present invention relates to a control unit (1), for automotive applications in particular, with: a frame (8) that includes a recess (9) across which electrical conductive tracks (10) extend to supply electrical power; a base plate (11) that is inserted in the frame (8); a circuit carrier (12) on which electronic components are mounted and which is installed on the base plate (11); an electrical connection (14) for connecting the circuit carrier (12) with the conductive tracks (10); and a cover (4) for hermetically sealing the control unit (1), the cover including a shaped section that is insertable in the associated recess (9) in the frame (8); whereby a sealing gel (16) is provided in recess (9) with a viscosity such that the sealing gel (16) can flow around the electrical conductive tracks (10) that extend across the recess (9). The present invention further relates to a manufacturing method for manufacturing a control unit (1) of this type.

7 Claims, 6 Drawing Sheets

CONTROL UNIT AND METHOD FOR PRODUCING THE SAME

BACKGROUND INFORMATION

The present invention relates to a control unit, for automotive applications in particular, according to the definition of the species in Claim 1, and a method for manufacturing the control unit.

In automotive applications in particular, control units are subjected to strong mechanical loads due to vibratory stresses.

Control units are used in automotive applications for transmission-shift control, for example. A control unit according to the related art is described below with reference to FIGS. 1 and 2. FIG. 1 shows an underside view of a conventional control unit, and FIG. 2 shows a lateral cross-sectional view of the conventional control unit along the line A—A in FIG. 1.

Control unit 1 contains, for example, a hybrid control unit 2, sensors and at least one plug-in connector for connection to a vehicle wiring harness and/or a transmission connector. The electrical connection between hybrid control unit 2, the sensors and the transmission connector is established via a pressed screen 3. Control unit 1 includes a cover 4 designed to ensure that control unit 1 is closed. Furthermore, the electronic circuit is provided on hybrid control unit 2 in the housing. Glass-enclosed pins 5 are located on the underside of control unit 1 to establish electrical contact between the electronic circuit and pressed screen 3, the pins being mounted on a pin strip 6. The electrical contact of the circuit carrier with glass-enclosed pins 5 is established via bonding, and glass-enclosed pins 5 are contacted with pressed screen 3 using laser welding.

Control unit housings are used in various applications, e.g., in ABS systems, in the case of which the conductive tracks are injected in a plastic housing in which the electronic circuit is located, to establish contact with the circuit. The housing is closed with a cover 4 in a conventional manner, the cover being either bonded to the carrier of the control unit or cast therein.

A disadvantage of the known procedure described above is the fact that the conductive tracks injected in the plastic cannot be sealed completely.

Various proposals for improving the seal between the conductive tracks and the plastic are found in the related art. For example, the conductive tracks are pressed into the plastic in the form of pins, whereby the pins must have an exactly defined, highly precise shape.

According to a further proposal, each conductive track is enclosed in a plastic material that is designed to perform the sealing function.

Both means of achieving the object of the inventions have the disadvantage, however, that they can be realized technically and are economically practical only when a few connecting lines and/or conductive tracks are required and the distances between the connections and/or conductive tracks are relatively great.

ADVANTAGES OF THE INVENTION

Compared to the known means of achieving the object of the inventions, the control unit according to the present invention having the features of Claim 1, and the corresponding procedure for manufacturing the same, according to Claim 8, have the advantage that a control unit is created that is completely hermetically sealed while ensuring that the circuit located in the housing is contacted to the outside in a simple manner, whereby a large number of contacts can be easily provided.

Furthermore, the contacts can have a small grid pattern, which reduces the amount of installation space required, and they can be located relatively at random. In addition, the control unit according to the present invention can be manufactured in a simple and, therefore, economical manner.

According to the idea on which the present invention is based, a sealing gel is provided in a recess in the frame of the control unit, the sealing gel having a viscosity such that it can flow around the electrical conductive tracks that pass through the recess and around a shaped section of a cover that is inserted in the recess.

It is therefore ensured by way of a single seal that each conductive track is sealed individually and a seal is provided between the base plate and the cover of the control unit. The geometric configuration of the individual conductive tracks is inconsequential, so that when a pressed screen is used for the conductive tracks, for example, folds, constrictions, etc. on the punched edges do not affect the sealing behavior. Furthermore, no particular geometric accuracy of the conductive tracks and/or the grid pattern between the conductive tracks is required. Simple, economical manufacture is therefore possible.

Since the conductive tracks can be present in any number and in any pattern of distribution on and/or in the housing frame, it is easier to adapt to the requirements of the circuit layout and/or the surrounding structural conditions.

In addition to the circuit carrier, further electronic components can be provided in the housing and contacted with the circuit carrier and/or to the outside. Expensive installation space in the control unit and/or on the circuit carrier can therefore be spared. Components that cannot be located on the circuit carrier, for example, such as large capacitors or components having high electromagnetic radiation or power loss, can still be contacted with the circuit carrier in a simple manner.

Advantageous further developments and improvements of the control unit described in Claim 1 and of the method for manufacturing the same described in Claim 8 are provided in the subclaims.

According to a preferred further development, the sealing gel is designed as silicone gel that retains its elastic properties after a possible hardening procedure.

According to another preferred further development, the shaped section on the cover includes as least one receiving area for receiving a certain amount of the sealing gel when the control unit is in a pressed-in state. When force is applied, the sealing gel can therefore enter the receiving area of the shaped section and ensure a better seal.

The recess in the frame is preferably configured as a circumferential groove. Accordingly, the shaped section of the cover is preferably configured as the spring associated with the groove, the spring also having a circumferential configuration.

The cover is preferably joinable with the frame using laser welding, a snap-in connection, a shaped spring device or the like. The preferred connecting means can be selected in accordance with the application of the control unit and/or the site of application of the control unit.

The base plate is composed, particularly advantageously, of a material having good thermal conductivity, e.g., metal. Good heat dissipation to a cooling surface connected with the base plate is therefore ensured.

The conductive tracks are configured as pressed-screen conductive tracks or as flexible-foil conductive tracks in particular. Another configuration of the conductive track is also feasible, however, since the viscous sealing gel can flow around any geometric shape.

According to another preferred further development, the control unit is pressed onto the associated surface by way of a spring device. This surface can be the carrier surface of a transmission housing or a cooling surface having a different configuration. This application of force creates hydrostatic pressure in the sealing gel, which markedly improves the sealing property. Furthermore, the entire structure of the control unit is held together by the action of force.

DRAWING

Exemplary embodiments of the present invention are shown in the drawing and are described in greater detail in the description below.

DETAILED DESCRIPTION OF THE EXEMPLARY EMBODIMENT

Figure 1:
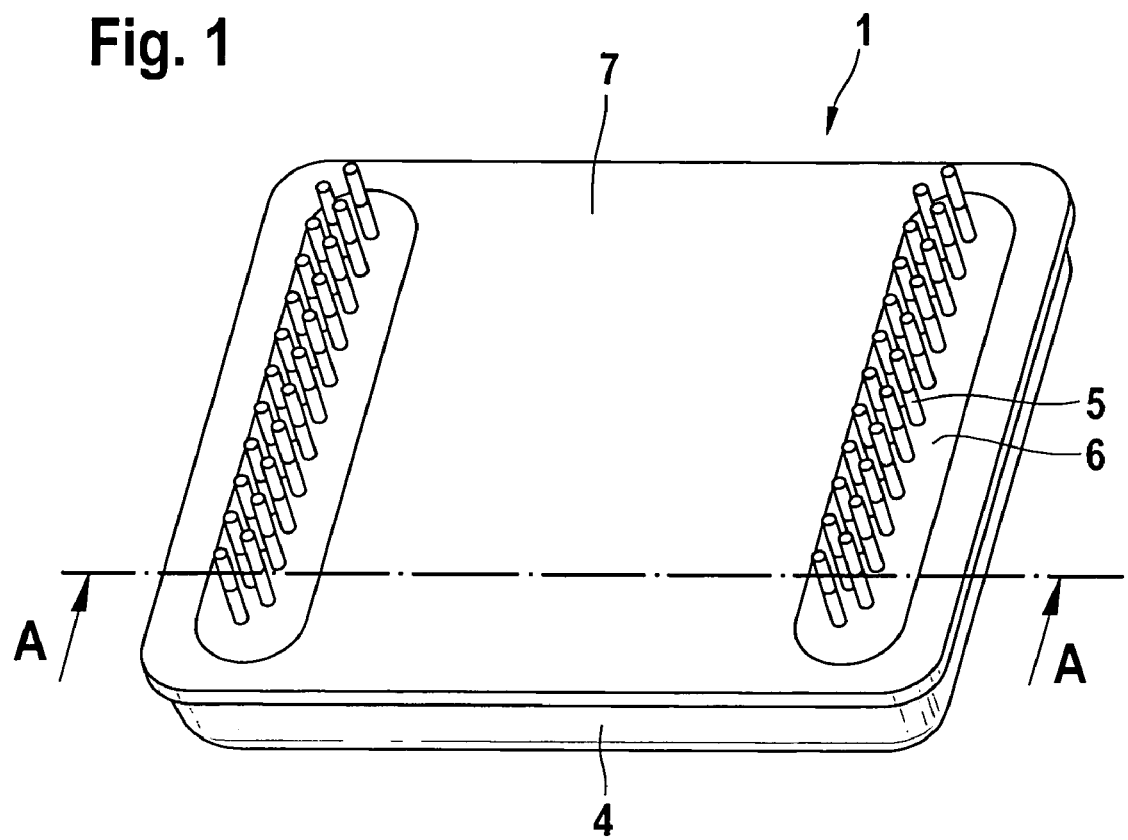
FIG. 1 shows an underside view of a control unit according to the related art.
Figure 2:
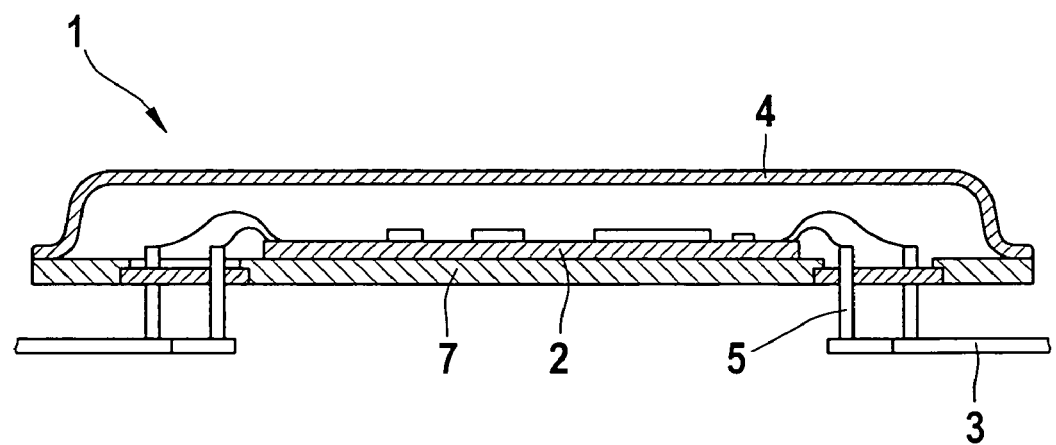
FIG. 2 shows a lateral cross-sectional view of the control unit in FIG. 1 along the line A—A.

In the figures, the same reference numerals are used to label components that are the same or that perform the same function.

Figure 3:
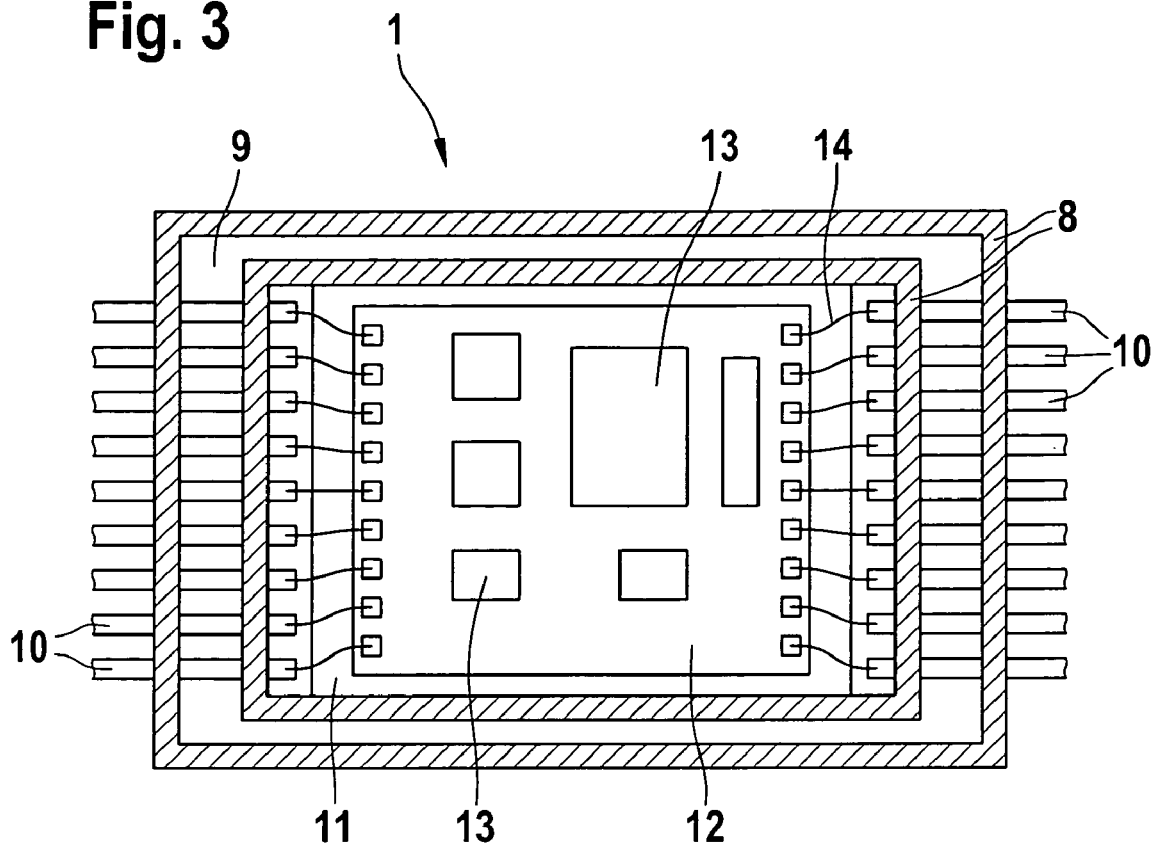
FIG. 3 shows a top view of a control unit according to a first exemplary embodiment of the present invention with the cover removed.

FIG. 3 shows a top view of a control unit 1 with the cover removed according to a first exemplary embodiment of the present invention. Control unit 1 includes a frame 8 that is preferably made of plastic and includes a circumferential groove 9.

Conductive tracks 10 are preferably injected into plastic frame 8 and extend through groove 9. Conductive tracks 10 can be configured as pressed-screen conductive tracks or as flexible-foil conductive tracks.

Control unit 1 further includes a base plate 11 that is preferably made of a material with good heat-conducting properties. Base plate 11 can be made of metal, for example. A circuit carrier 12, e.g., an LTCC or a hybrid, is located on base plate 11, the circuit carrier being equipped with electronic components 13. Circuit carrier 12 is contacted electrically with conductive tracks 10 preferably via a bond connection 14.

Control unit 1 is furthermore closed with a cover (not shown in FIG. 3), whereby a sealing gel is filled between the cover, frame 8 and base plate 11. This is described in greater detail below in the description of the further figures.

Figure 4:
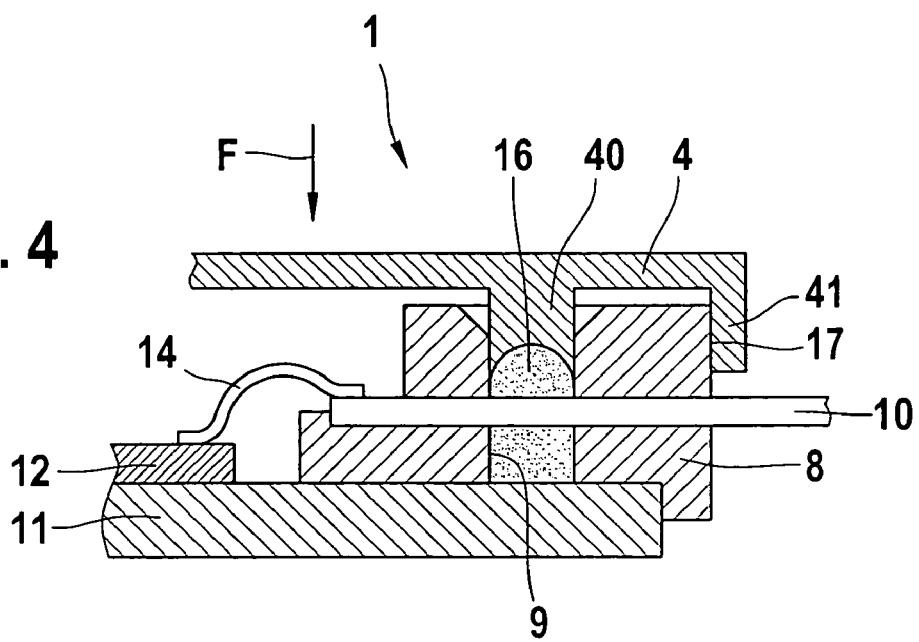
FIG. 4 shows a section of a lateral cross-sectional view of a control unit according to a second exemplary embodiment of the present invention.

FIG. 4 shows a partial section of a lateral cross-sectional view of a control unit 1 according to a second exemplary embodiment of the present invention. As shown in FIG. 4, conductive tracks 10 extend through circumferential groove 9 provided in frame 8. A sealing gel 16, which will be described in detail below, is filled into groove 9. Cover 4 includes a spring and/or shaped section 40 associated with groove 9, the spring and/or shaped section also preferably having a circumferential configuration. Shaped section 40 is configured as a spring such that it is insertable in associated groove 9 in a form-locked manner when cover 4 is placed on frame 8. For example, shaped section 40 of cover 4 has a shape on its free end that corresponds to two sealing lips; this provides additional protection against sealing gel 16 seeping between frame 8 and cover 4.

The individual method steps for manufacturing control unit 1 are explained below as examples. First, base plate 11 is pressed and/or glued into frame 8.

Circuit carrier 12 is then glued to base plate 11, and electronic components (not shown) are mounted on it. Electronic components can also be applied before circuit carrier 12 is mounted on base plate 11.

Contact is then established between circuit carrier 12 and conductive tracks 10, whereby a bond connection 14 is preferably used for a contact of this type.

A sealing gel 16 is then poured into circumferential groove 9 of frame 8, whereby sealing gel 16 has a viscosity such that sealing gel 16 flows around conductive tracks 10 that extend through groove 9. Sealing gel 16 is preferably made of a material that retains its elastic properties after a possible hardening procedure. Sealing gel 16 is composed of silicone, for example.

Cover 4, which is also preferably a plastic injection-molded part, is then inserted into groove 9 of frame 8 via its shaped section 40 and is preferably acted upon with a predetermined amount of force F in the direction of the arrow shown in FIG. 4 such that hydrostatic pressure builds in the sealing gel, which is the pressure required to seal the arrangement.

A plurality of variations is imaginable for applying force F to cover 4. According to the second exemplary embodiment of the present invention, as shown in FIG. 4, cover 4 can be joined with frame 8 using a laser-welded joint 17. For this purpose, cover 4 includes an edge section 41, the inner surface of which bears against an exterior surface of frame 8 and is the preferred welding location.

Figure 5:
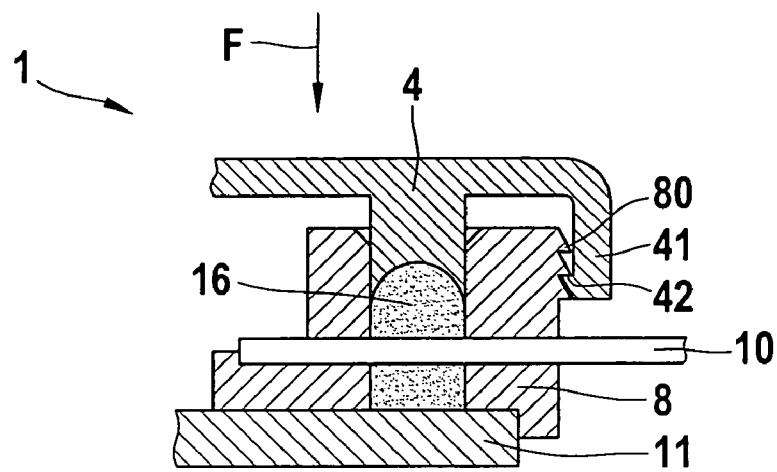
FIG. 5 shows a section of a lateral cross-sectional view of a control unit according to a third exemplary embodiment of the present invention.

FIG. 5 shows a section of a lateral cross-sectional view of a control unit 1 according to a third exemplary embodiment of the present invention. Edge section 41 of cover 4 includes lock-in projections 42 that can preferably engage in multiple stacked notches 80 in the surface of frame 8 associated with edge section 41.

Figure 6:
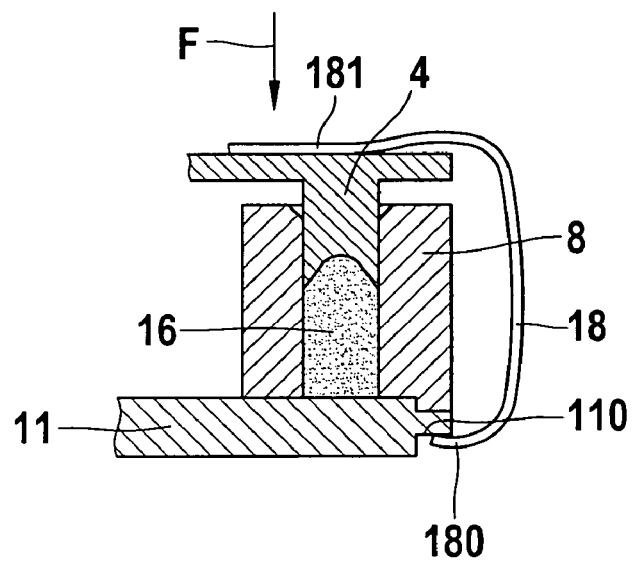
FIG. 6 shows a section of a lateral cross-sectional view of a control unit according to a fourth exemplary embodiment of the present invention.
Figure 7:
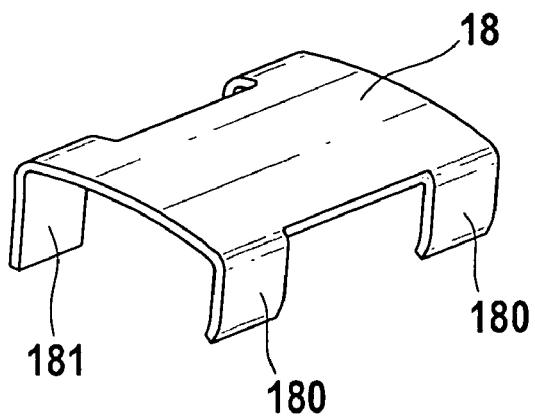
FIG. 7 shows a perspective view of the shaped spring device in FIG. 6.
Figure 8:
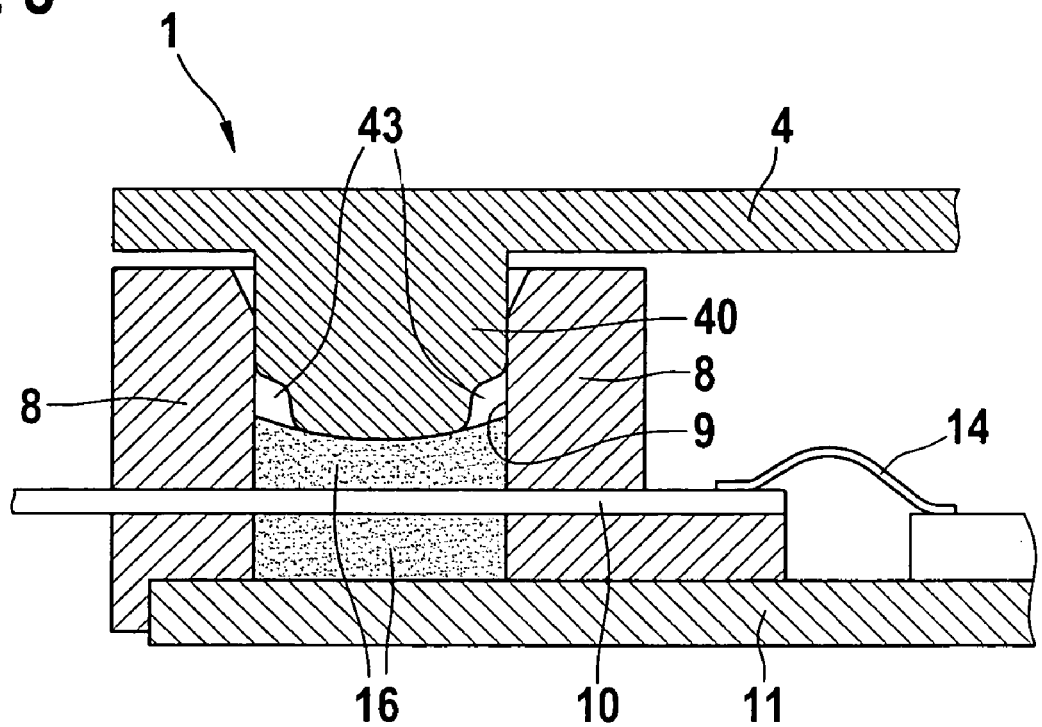
FIG. 8 shows a section of a lateral cross-sectional view of a control unit according to a fifth exemplary embodiment of the present invention in a first state.

FIG. 6 shows a partial section of a lateral cross-sectional view of a control unit 1 according to a fourth exemplary embodiment of the present invention. Force F is applied by a shaped spring device 18 that is configured, for example, as shown in FIG. 8 in a perspective view. Shaped spring device 18 is composed preferably of metal and is pretensioned in the direction of the longitudinal axis of shaped spring device 18. Shaped spring device 18 includes a pair of shorter snap-in hooks 180 and a pair of longer snap-in hooks 181. In the installed state, shorter snap-in hooks 180, for example, are engaged with a projection 110 on base plate 11, and longer snap-in hooks 181 bear against the top surface of cover 4. As a result, cover 4 is pressed by metallic shaped spring device 18 in the direction of base plate 11 with a predetermined amount of force F. The shape required for lateral fixation of shaped spring device 18 on base plate 11 is advantageously created by extruding base plate 11.

Figure 9:
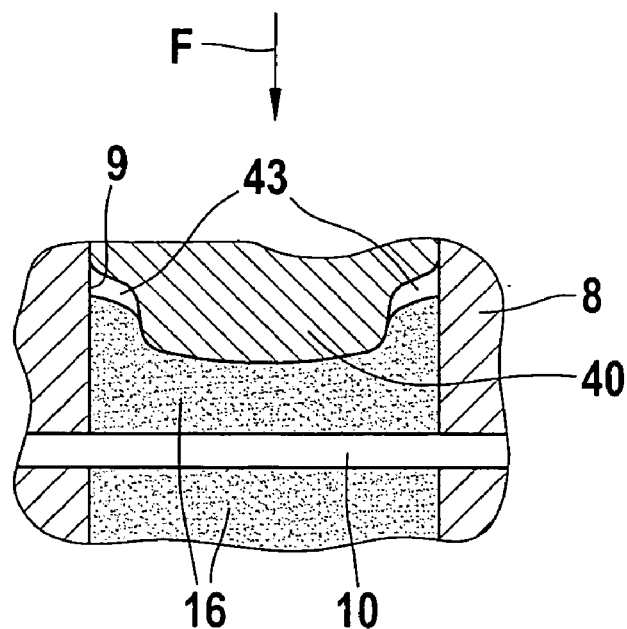
FIG. 9 shows a section of a lateral cross-sectional view of a control unit according to a fifth exemplary embodiment of the present invention in a second state.

FIGS. 8 and 9 show a partial section of a lateral cross-sectional view of a control device 1 according to a fifth exemplary embodiment of the present invention in a first and second state.

In FIG. 8, shaped section 40 and/or spring 40 of cover 4 is inserted in groove 9 such that the front side of shaped section 40 comes in contact with sealing gel 16. According to this exemplary embodiment, shaped section 40 includes at least one receiving region 43 that is preferably configured as a circumferential material recess, by way of which hydrostatic pressure is created in sealing gel 16 when force F is applied to cover 4 in the direction of the arrow in FIG. 9 and a portion of sealing gel 16 is pressed into the volume formed by recesses 43, as shown in FIG. 9. An improved seal of the arrangement can be achieved as a result.

Figure 10:
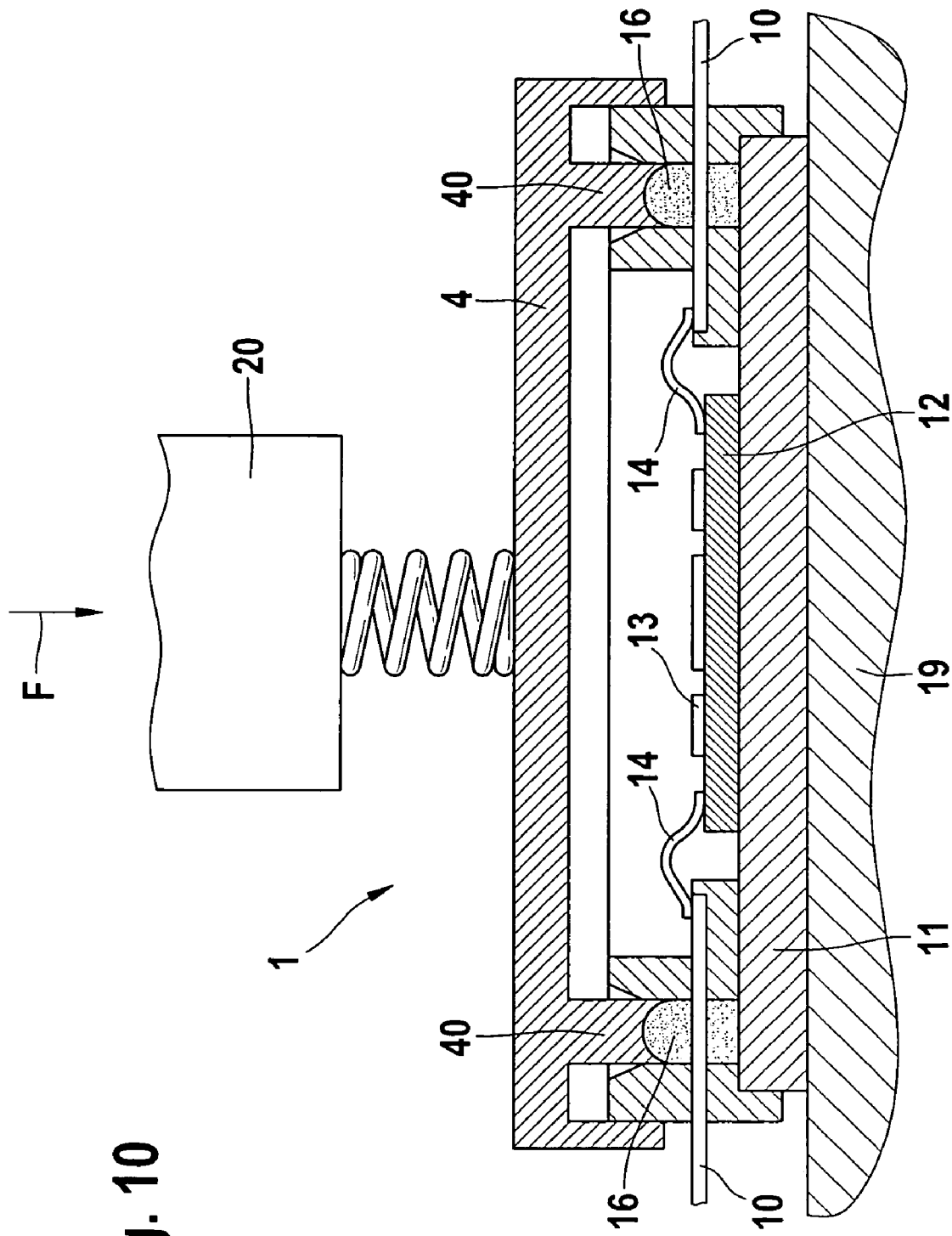
FIG. 10 shows a section of a lateral cross-sectional view of a control unit according to a sixth exemplary embodiment of the present invention.

FIG. 10 shows a lateral cross-sectional view of control unit 1 according to a sixth exemplary embodiment of the present invention. Since control unit 1 is designed to be used in an automatic transmission for automotive applications— in which extremely high operating temperatures exist— contact cooling for control unit 1 is advantageous. For this reason, control unit 1 with the preferably metallic base plate 11 can be mounted on a cooling surface 19 in a transmission housing, for example. A spring device 20 is provided to apply the contact pressure, the spring device pressing cover 4 onto base plate 11, by way of which sealing gel 16 is located in the flow of force of spring device 20. Furthermore, a complex manner of affixing base plate 11 in frame 8 can also be eliminated as a result.

Figure 11:
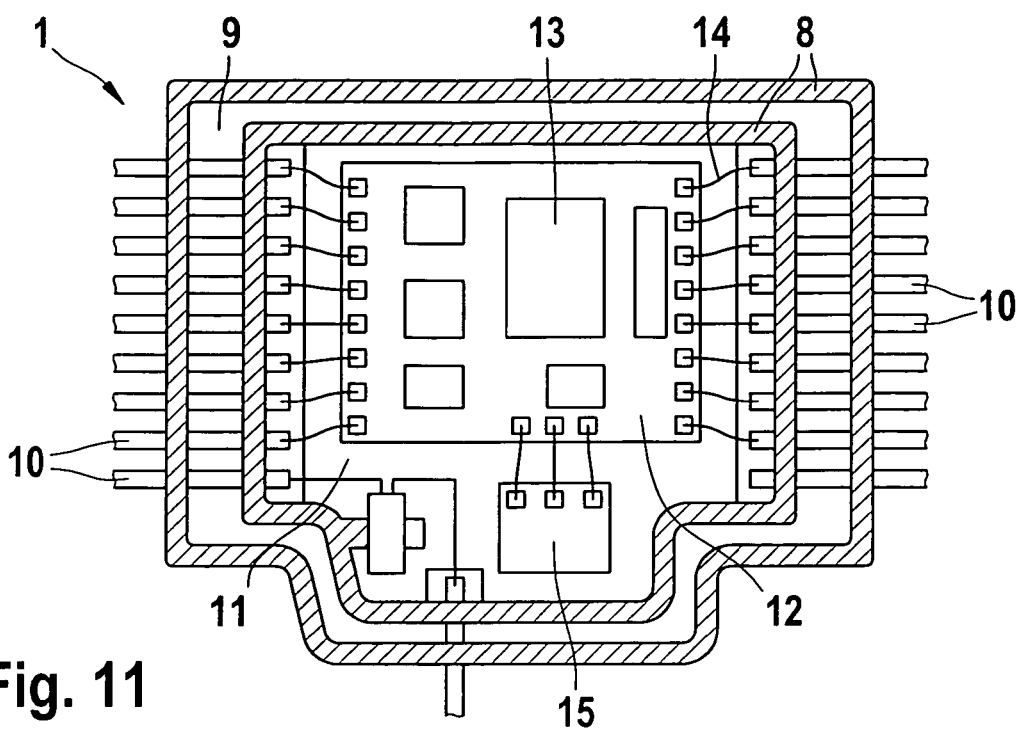
FIG. 11 shows a top view of a control unit according to a seventh exemplary embodiment of the present invention with the cover removed.

FIG. 11 shows a top view of a control unit 1 according to a seventh exemplary embodiment of the present invention, without the cover in place. It is clear that control unit 1 can have any shape that is advantageous to enable the necessary electronic components and circuits to be placed in the interior region. The cover and its associated shaped section are shaped in accordance with the particular groove such that a form-locked insertion of the cover into groove 9 is ensured.

Furthermore, by way of a certain spacial configuration of control unit 1, it is possible to house further electronic components 15 in addition to the circuit carrier in the housing, as shown in FIG. 11, and to contact them with the circuit carrier or toward the outside. An additional advantage can be obtained as a result, since expensive surface area on the circuit carrier can be spared and components can be used that cannot be built on the circuit carrier due to their dimensions or their excessive electromagnetic radiation and/or power losses.

Figure 12:
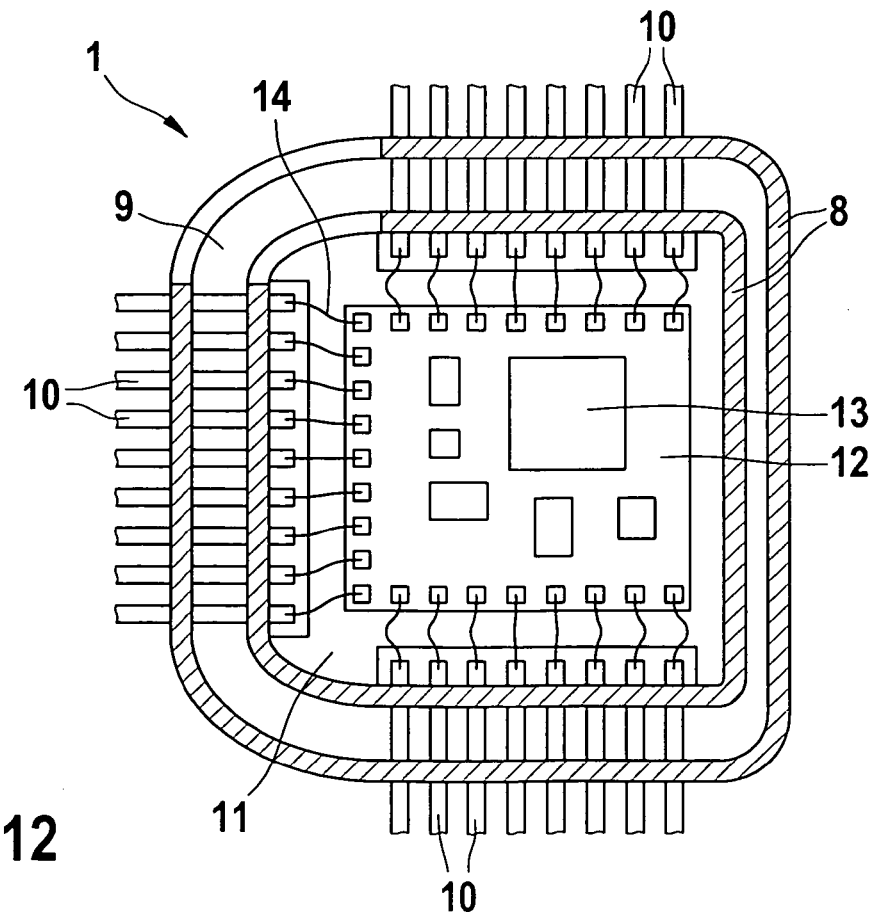
FIG. 12 shows a top view of a control unit according to an eighth exemplary embodiment of the present invention with the cover removed.

FIG. 12 shows a top view of a control unit 1 with the cover removed, according to an eighth exemplary embodiment of the present invention. It is obvious to one skilled in the art that conductive tracks 10 can be located on only one side or on a plurality of sides of frame 8, in accordance with the particular application.

Although the present invention was described above with reference to preferred exemplary embodiments, it is not limited to them and, instead, can be modified in a diverse manner.

The present invention therefore creates a control unit and a method for manufacturing the same, the method providing a hermetic seal for the interior space in which the circuit carriers and associated electronic components are located. The control unit is configured such that individualized sealing is ensured for each conductive track and a seal against the base plate and cover is ensured by way of a single seal, namely via the sealing gel. As a result, the exact geometric configuration of the individual conductive tracks is inconsequential, i.e., folds, constrictions, etc. on the punched edges are not significant, since the sealing gel, with its predetermined viscosity, flows around the conductive tracks having any shape. Simple, economical manufacture of a hermetically sealed control unit is therefore possible.

The number and distribution of the individual conductive tracks on the housing frame can therefore be configured in any possible manner, enabling easy adaptation to the specification of the circuit layout and/or surrounding structural conditions.

What is claimed is:

1. A control unit (1), for automotive applications in particular, with:
    a frame (8) that includes a recess (9) across which electrical conductive tracks (10) extend to supply electrical power;
    a base plate (11) that is inserted in the frame (8);
    a circuit carrier (12) on which electronic components are mounted and which is installed on the base plate (11);
    an electrical connection (14) for connecting the circuit carrier (12) with the conductive tracks (10); and with
    a cover (4) for hermetically sealing the control unit (1), the cover including a shaped section that is insertable in the associated recess (9) in the frame (8);
    wherein
    a sealing gel (16) is provided in recess (9) with a viscosity such that the sealing gel (16) can flow around the electrical conductive tracks (10) that extend across the recess (9).

2. The control unit as recited in claim 1,
    wherein
    the sealing gel (16) is designed as silicone gel, which remains elastic after a possible hardening procedure.

3. The control unit as recited in claim 1,
    wherein
    the shaped section (40) of the cover (4) includes at least one receiving area (43) for receiving sealing gel in a pressed-together state.

4. The control unit as recited in claim 1,
    wherein
    the recess (9) of the frame (4) is configured as a circumferential groove (9), and the shaped section (40) of the cover (4) is configured as the spring (40) associated with the groove (9).

5. The control unit as recited in claim 1,
    wherein
    the cover (4) is capable of being joined with the frame (8) using laser welding (17), a snap-in connection (41, 42), a shaped spring device (18) or the like.

6. The control unit as recited in claim 1,
    wherein
    the base plate (11) is made of a material with good thermal conductivity, e.g., metal.

7. The control unit as recited in claim 1,
    wherein
    the conductive tracks (10) are configured as pressed-screen tracks or as flexible-foil tracks.

* * * * *